(12) United States Patent
Koltonski (10) Patent No.: US 12,020,955 B2
(45) Date of Patent: *Jun. 25, 2024

(54) SYSTEMS FOR PROCESSING ONE OR MORE SEMICONDUCTOR DEVICES, AND RELATED METHODS

(71) Applicant: Micron Technology, Inc., Boise, ID (US)

(72) Inventor: Michael E. Koltonski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 48 days.

This patent is subject to a terminal disclaimer.

(21) Appl. No.: 17/447,760

(22) Filed: Sep. 15, 2021

(65) Prior Publication Data

US 2022/0005711 A1 Jan. 6, 2022

Related U.S. Application Data

(63) Continuation of application No. 15/976,623, filed on May 10, 2018, now Pat. No. 11,164,759.

(51) Int. Cl.
*H01L 21/67* (2006.01)
*F28D 1/02* (2006.01)
(Continued)

(52) U.S. Cl.
CPC ...... *H01L 21/67069* (2013.01); *F28D 1/0213* (2013.01); *H01J 37/32091* (2013.01); *H01J 37/32724* (2013.01); *H01L 21/3065* (2013.01)

(58) Field of Classification Search
None
See application file for complete search history.

(56) References Cited

U.S. PATENT DOCUMENTS 5,667,622 A 9/1997 Hasegawa et al.
6,026,896 A 2/2000 Hunter
(Continued)

FOREIGN PATENT DOCUMENTS

CN 102918641 A 2/2013
CN 103930843 A 7/2014
(Continued)

OTHER PUBLICATIONS

International Search Report from International Application No. PCT/US2019/028846, dated Sep. 26, 2019, 3 pages.
(Continued)

*Primary Examiner* — Jeffrie R Lund
*Assistant Examiner* — Tiffany Z Nuckols
(74) *Attorney, Agent, or Firm* — TraskBritt (57) ABSTRACT

A system for fabricating a semiconductor device structure includes a tool comprising a chamber and a platform within the chamber configured to receive a semiconductor device structure thereon. The tool further includes a heating and cooling system in operable communication with the platform and configured to control a temperature of the platform. The heating and cooling system comprises a cooling system including a cold tank for containing a cold thermal transfer fluid, the cold tank configured to be in fluid communication with the platform, thermal transfer fluid supply piping, and thermal transfer fluid return piping, a heating system including a hot tank for containing a hot thermal transfer fluid having a higher temperature than the cold thermal transfer fluid, the hot tank configured to be in fluid communication with the platform, the thermal transfer fluid supply piping, and the thermal transfer fluid return piping, and at least one temporary storage tank configured to receive at least some of the cold thermal transfer fluid or the hot thermal transfer fluid from at least the thermal transfer fluid (Continued)

return piping after switching a thermal load from the platform from one of the cooling system or the heating system to the other of the cooling system or the heating system. Related methods and tools are disclosed.

13 Claims, 5 Drawing Sheets

(51) Int. Cl.
*H01J 37/32* (2006.01)
*H01L 21/3065* (2006.01)

(56) References Cited

U.S. PATENT DOCUMENTS

| | | |
|---|---|---|
| 6,822,202 B2 | 11/2004 | Atlas |
| 7,637,114 B2 | 12/2009 | Choi et al. |
| 7,827,930 B2 | 11/2010 | Lubomirsky et al. |
| 8,809,197 B2 | 8/2014 | Tabuchi |
| 8,916,793 B2 | 12/2014 | Silveira et al. |
| 9,034,771 B1 | 5/2015 | Nangoy |
| 9,520,308 B2 | 12/2016 | Han et al. |
| 9,659,756 B2 | 5/2017 | Kikuchi |
| 9,852,888 B2 | 12/2017 | Goto |
| 2007/0289732 A1 | 12/2007 | Pillion et al. |
| 2008/0314564 A1 | 12/2008 | Nagaseki et al. |
| 2009/0126378 A1 | 5/2009 | Oh |
| 2011/0284505 A1 | 11/2011 | Ricci et al. |
| 2012/0186745 A1 | 7/2012 | Miya et al. |
| 2013/0008609 A1 | 1/2013 | Koshimizu et al. |
| 2013/0105081 A1* | 5/2013 | Silveira ............ H01J 37/32724 |
| | | 156/345.52 |
| 2014/0262199 A1 | 9/2014 | Kobayashi et al. |
| 2015/0053375 A1* | 2/2015 | Atlas ..................... F16K 3/00 |
| | | 165/104.28 |
| 2015/0107268 A1 | 4/2015 | Han et al. |
| 2015/0176928 A1* | 6/2015 | Tabuchi ............ G05D 23/1951 |
| | | 165/96 |
| 2016/0196960 A1 | 7/2016 | Goto |
| 2016/0196991 A1 | 7/2016 | Shiga |

FOREIGN PATENT DOCUMENTS

| | | |
|---|---|---|
| KR | 10-1367086 B1 | 2/2014 |
| KR | 10-2017-0039369 B1 | 5/2017 |
| KR | 10-1739369 B1 | 5/2017 |
| TW | 200633032 A | 9/2006 |
| WO | 2007/073091 A1 | 6/2007 |

OTHER PUBLICATIONS

International Written Opinion from International Application No. PCT/US2019/028846, dated Sep. 26, 2019, 6 pages.
Second Taiwanese Office Action for Application No. 108115334, dated Jan. 7, 2021, 17 pages.
Taiwanese Office Action for Taiwan Application No. 108115334, dated May 14, 2020, 11 pages.
Taiwanese Third Office Action for Application No. 108115334, dated Aug. 9, 2021, 16 pages.
Chinese First Office Action for Chinese Application No. 201980031546.4, dated Sep. 19, 2023, 13 pages with translation.

\* cited by examiner

SYSTEMS FOR PROCESSING ONE OR MORE SEMICONDUCTOR DEVICES, AND RELATED METHODS

CROSS-REFERENCE TO RELATED APPLICATION

This application is a continuation of U.S. patent application Ser. No. 15/976,623, filed May 10, 2018, now U.S. Pat. No. 11,164,759, issued Nov. 2, 2021, and titled "TOOLS AND SYSTEMS FOR PROCESSING A SEMICONDUCTOR DEVICE STRUCTURE, AND RELATED METHODS," the disclosure of which is hereby incorporated herein in its entirety by this reference.

TECHNICAL FIELD

Embodiments disclosed herein relate to tools and systems for processing semiconductor device structures, and to related methods. More particularly, embodiments of the disclosure relate to tools and systems for processing semiconductor device structures, such systems including a heating and cooling apparatus comprising at least a hot tank and a cold tank and configured to maintain a desired temperature of a semiconductor substrate such as a semiconductor wafer in a tool within desired tolerances and time frames when heating and cooling requirements of the tool change, and to related methods of maintaining the desired temperature.

BACKGROUND

Fabrication of semiconductor devices includes, among other things, forming materials on a semiconductor substrate and patterning the materials to form discrete features isolated from each other by, for example, dielectric materials. Forming the materials on the substrate may include depositing one or more materials on the substrate by atomic layer deposition, chemical vapor deposition, physical vapor deposition, or other methods. Forming the materials on the substrate may include maintaining and altering suitable conditions, such as temperature and pressure, proximate the semiconductor substrate, which may be located in a tool, such as a deposition chamber.

Patterning the materials on the substrate may be performed by etching, such as dry etching. Dry etching may include exposing the materials on the substrate to one or more dry etch gases (e.g., plasmas) in an etch tool. In some instances, the etch tool is maintained at a relatively low temperature (e.g., below about −50° C.) during patterning of the semiconductor wafer. After patterning the semiconductor wafer, it may be desired to clean the etch tool, which often includes increasing a temperature of the etch tool. Each act in the fabrication of semiconductor device may include maintaining a desired temperature of the semiconductor wafer in the etch tool within desired tolerances and time frames. However, as the temperature difference between the hot and cold requirements of the tool increases, the tool may struggle to maintain a desired temperature within the tool within a suitable time frame. For example, in some etch tools, when the temperature of the etch tool is changed by a temperature greater than about, for example, 50° C., the thermal load on the chiller may be too large to adequately control the temperature within a desired time.

DETAILED DESCRIPTION

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure, a tool used during processing of a semiconductor device structure, or a complete description of a process flow for fabricating a semiconductor device. The structures described below do not form complete semiconductor device structures, or tools or systems for processing semiconductor device structures. Only those process acts and structures necessary to understand the embodiments described herein are described in detail below. Additional acts to form a complete semiconductor device structure or a tool or system for processing a semiconductor device structure may be performed by conventional techniques.

As used herein, the term "piping" means and includes pipe, conduits, tubes, or any means for transmitting (e.g., conveying) one or more substances from one location to another. Piping may include suitable conduits, fittings, valves, flanges, or other components for forming a sealed system for transmitting the one or more substances.

According to embodiments disclosed herein, a semiconductor device structure such as semiconductor wafer or other semiconductor substrate (including, for example, one or more semiconductor devices) is fabricated in a wafer processing tool, such as, but not limited to, an etch tool. Processing of a semiconductor wafer may include operating the etch tool at a wide range of temperatures, such as when the semiconductor wafer is patterned or when the etch tool is cleaned. For example, during processing of the semiconductor wafer, the etch tool may be repeatedly operated at temperatures as low as about −70° C. during patterning of the semiconductor wafer and temperatures as high as about 70° C. during cleaning of the etch tool, during different patterning acts, or both. The etch tool may include a wafer stage (e.g., an electrostatic chuck) on which the semiconductor wafer may be disposed during processing of the semiconductor wafer. The etch tool may include a heating and cooling apparatus in operable communication with at least a portion of the etch tool (such as the electrostatic chuck) configured to control a temperature of the at least a portion of the etch tool. In some embodiments, the heating and cooling apparatus is in operable communication with the electrostatic chuck and is configured to heat and cool the electrostatic chuck to a desired temperature. In other wafer processing tools, the wafer stage may not comprise an electrostatic chuck, and for purposes of the present disclosure, the structure to be heated and cooled according to embodiments of the disclosure may be generally referred to as a "platform." The term "platform" does not, however, require or imply that the platform structure is configured for support of a semiconductor device structure thereon.

The heating and cooling apparatus may include a hot tank containing a hot thermal transfer fluid and a cold tank containing a relatively cold thermal transfer fluid. As used herein, although the hot tank may be described as "containing" the hot thermal transfer fluid and the cold tank may be described as "containing" the cold thermal transfer fluid, the disclosure is not so limited. It will be understood that the hot thermal transfer fluid or the cold thermal transfer fluid may not be contained within the respective hot tank and cold tank. Rather, the hot tank and cold tank may be configured to hold such fluids, even if such fluids are not physically contained in the tanks. A temperature difference between the hot thermal transfer fluid and the cold thermal transfer fluid may be as much as about 140° C. (e.g., as much as about 160° C., as much as about 180° C., as much as about 200° C., as much as about 250° C., or even as much as about 300° C.). During some portions of processing of the semiconductor wafer, it may be desirable to maintain the semiconductor wafer at an elevated temperature (e.g., about 70° C.) and during other portions of processing of the semiconductor wafer, it may be desirable to maintain the semiconductor wafer at a lower temperature (e.g., −70° C.). The temperature of the semiconductor wafer may be controlled by disposing the semiconductor wafer on a platform (e.g., an electrostatic chuck) and controlling a temperature of the electrostatic chuck. Accordingly, during processing of the semiconductor wafer, it may be desired to repeatedly switch the temperature of the electrostatic chuck from an elevated temperature to a lower temperature and back from the lower temperature to the elevated temperature, such as between various etching acts, cleaning acts, deposition acts, or other acts. Accordingly, the heating and cooling apparatus may be configured to receive a thermal load from the electrostatic chuck to maintain one or more desired temperatures of the electrostatic chuck. The hot thermal transfer fluid may be circulated from the hot tank to the electrostatic chuck, from the electrostatic chuck through thermal transfer fluid return piping, and back to the hot tank to heat the electrostatic chuck to a desired elevated temperature and the cold thermal transfer fluid may be circulated from the cold tank to the electrostatic chuck, from the electrostatic chuck to the thermal transfer fluid return piping, and back to the cold tank to cool the electrostatic chuck to a desired lower temperature. The heating and cooling system further includes at least one temporary storage tank for storing the thermal transfer fluid for a duration when switching the temperature (e.g., the thermal load) of the electrostatic chuck.

According to some embodiments, when it is desired to switch a temperature of the electrostatic chuck (e.g., switch (place) the thermal load of the electrostatic chuck from one of the hot tank or the cold tank to the other of the hot tank or the cold tank), circulation of the one of the hot thermal transfer fluid or the cold thermal transfer fluid to the electrostatic chuck is stopped and circulation of the other of the hot thermal transfer fluid or the cold thermal transfer fluid to the electrostatic chuck begins. However, after switching the thermal load on the electrostatic chuck, the thermal transfer fluid return piping is filled with the previously circulated thermal transfer fluid (i.e., when the thermal load is switched from the hot tank to the cold tank, a portion of the hot thermal transfer fluid remains in the thermal transfer fluid return piping; similarly, when the thermal load is switched from the cold tank to the hot tank, a portion of the cold thermal transfer fluid remains in the thermal transfer fluid return piping). In other words, after switching the thermal load of the electrostatic chuck, the thermal transfer fluid return piping includes a surge volume of the thermal transfer fluid, the thermal transfer fluid in the thermal transfer fluid return piping having an undesired temperature. The thermal transfer fluid remaining in the thermal transfer fluid return piping immediately after switching the thermal load of the electrostatic chuck may be referred to herein as a "surge volume" of thermal transfer fluid.

Since the temperature difference between the hot thermal transfer fluid and the cold thermal transfer fluid may be greater than about 50° C. (e.g., greater than about 100° C., greater than about 140° C., etc.), it is undesired to direct the surge volume of the thermal transfer fluid to the tank from which the thermal transfer fluid is circulating to the electrostatic chuck. Accordingly, in some embodiments, the surge volume of the thermal transfer fluid in the thermal transfer fluid return piping is directed to a temporary tank substantially immediately after switching the thermal load of the electrostatic chuck from one of the hot tank or the cold tank to the other of the hot tank or the cold tank. After the temperature of the thermal transfer fluid in the thermal transfer fluid return piping is within a predetermined range of the temperature of the thermal transfer fluid currently circulating to the electrostatic chuck, the circulating thermal transfer fluid in the thermal transfer fluid return piping is directed to the respective hot tank or cold tank. After the thermal load is switched again, the thermal transfer fluid in the temporary tank is directed to the hot tank or cold tank that is free of the thermal load from the electrostatic chuck (i.e., the hot tank or cold tank from which thermal transfer fluid is not presently circulating to the electrostatic chuck).

Directing the surge volume of the thermal transfer fluid to the temporary tank after switching the thermal load of the electrostatic chuck may facilitate improved temperature control of the electrostatic chuck. For example, the temperature of the electrostatic chuck may be repeatedly changed by as much as about 140° C. (e.g., as much as about 160° C., as much as about 180° C., as much as about 200° C., as much as about 250° C., or even as much as about 300° C.) without excessive heating or cooling times (e.g., within less than about two minutes, such as less than about one minute, or even within less than about 30 seconds). By way of contrast, heating and cooling systems of etch tools that do not include the temporary tank and operate according to the methods described herein may exhibit undesired surges in temperature of one or both of a hot tank or cold tank responsive to receiving a surge of thermal transfer fluid having a substantially different temperature (e.g., more than about 50° C.) than a set-point of the electrostatic chuck and having a temperature substantially different than the temperature of the thermal transfer fluid circulating to the electrostatic chuck.

Figure 1:
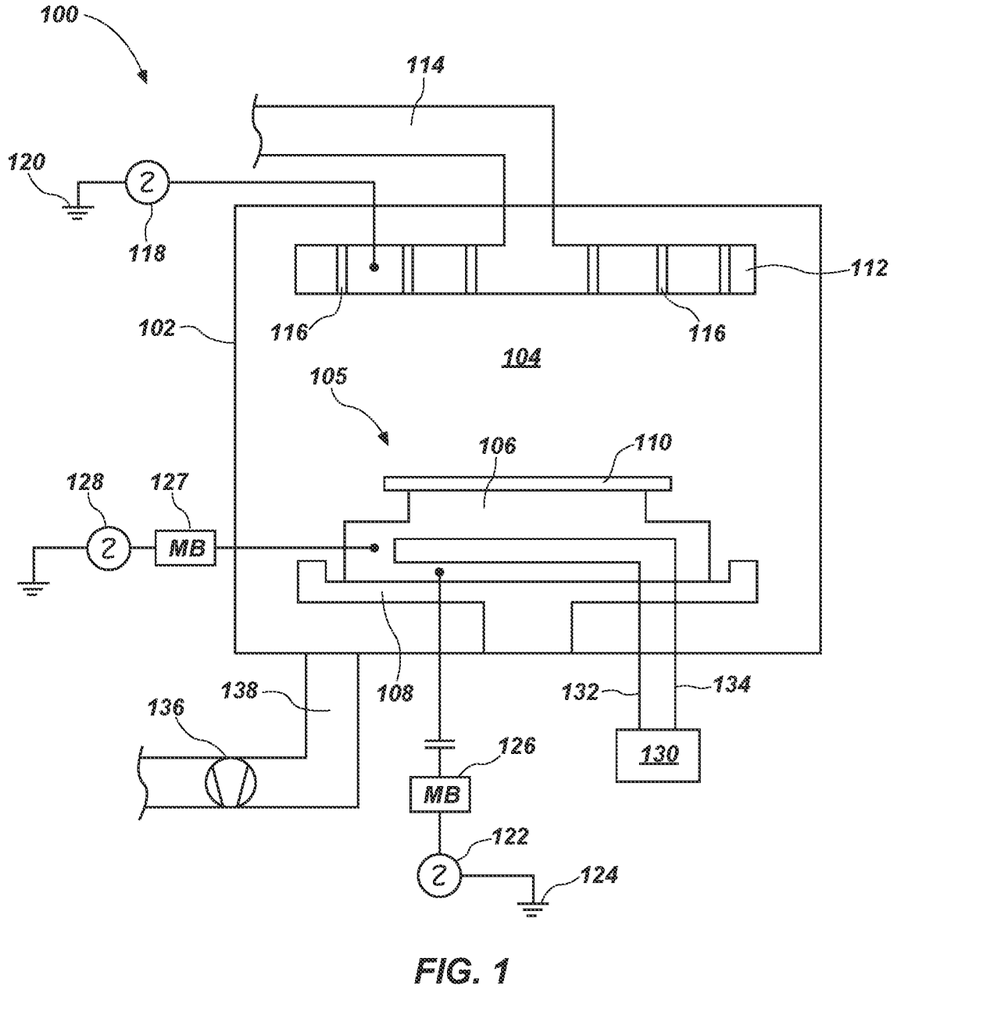
FIG. 1 is a simplified schematic of a tool for fabricating a semiconductor wafer, in accordance with embodiments of the disclosure.

FIG. 1 is a simplified schematic of a tool 100, such as an etch tool. The tool 100 may be configured to facilitate processing of at least a portion of a semiconductor device from, for example, a semiconductor wafer 110. In some embodiments, the tool 100 comprises an etch chamber, such as a dry etch chamber. In other embodiments, the tool 100 comprises a dry chamber, such as used in sublimation drying.

The tool 100 may include a chamber 102 (e.g., an etch chamber) wherein plasma is generated for patterning features on the semiconductor wafer 110. The tool 100 may include a substrate (e.g., wafer) holder assembly 105, shown in dashed lines in FIG. 1. The substrate holder assembly 105 may include an electrostatic chuck 106 disposed on a pedestal 108. The pedestal 108 may be configured to move up and down in the view illustrated in FIG. 1 to adjust a height of the semiconductor wafer 110 in the chamber 102.

In some embodiments, the electrostatic chuck 106 may comprise a lower electrode of the tool 100. The lower electrode may also be referred to as the cathode of the tool 100. The tool 100 may also include an upper electrode 112. The upper electrode 112 may comprise, for example, a gas distribution showerhead configured for distributing one or more gases from a gas supply line 114. The gas distribution showerhead may include apertures 116 for distributing the gas from the gas supply line 114 into the chamber 102. Although FIG. 1 illustrates that the upper electrode 112 and the gas distribution showerhead are the same, it is contemplated that in other embodiments, the tool 100 may include a gas distribution showerhead that is separate from the upper electrode 112.

The upper electrode 112 may be electrically coupled to a power source 118 for providing power to the upper electrode 112 (e.g., to the gas distribution showerhead) for providing power to the gas supplied by the gas supply line 114 and generating a plasma in a region 104 between the upper electrode 112 and the semiconductor wafer 110. The power source 118 may comprise a high frequency radio frequency (RF) power source, a direct current (DC) power source, or a combination of the two. As known in the art, the power source 118 may be electrically coupled to, for example, an inductive coil, for generating the radio frequency power. Adjustment of the frequency of the high frequency power source 118 may alter an ion flux of the plasma generated by the upper electrode 112. The upper electrode 112 and the high frequency power source 118 may be electrically connected to an electrical ground 120.

Plasma generated from the gas supply line 114 may be directed toward the semiconductor wafer 110. The semiconductor wafer 110 may be biased through the electrostatic chuck 106. The electrostatic chuck 106 may be configured to hold the semiconductor wafer 110 in place by application of RF power. The electrostatic chuck 106 may be electrically coupled to a power source 122 for generating a low radio frequency power to bias the electrostatic chuck 106 and may be electrically connected to a ground 124. The power source 122 may be electrically connected to the electrostatic chuck 106 through a matching box 126. The matching box 126 may be configured to cause the load impedance of the power source 122 to match an internal (or output) impedance thereof when plasma is generated in the chamber 102. In some embodiments, application of a radio frequency power source through the power source 122 may bias the electrostatic chuck 106 relative to the plasma in the region 104 to adjust a bombardment energy of the plasma toward the semiconductor wafer 110.

In some embodiments, the electrostatic chuck 106 may be electrically coupled to a power source 128, which may comprise a direct current power source or a high frequency radio frequency power source. In some embodiments, the power source 128 comprises a radio frequency power source and may be configured to provide low frequency RF power, high frequency RF power, or both to the electrostatic chuck 106. In some embodiments, the power source 128 is operably coupled to a matching box 127 configured to cause the load impedance of the power source 128 to match an internal (or output) impedance thereof when plasma is generated in the chamber 102. Application of power to the electrostatic chuck 106 through the power source 128 may bias the semiconductor wafer 110 to the electrostatic chuck 106 by electrostatic (e.g., Coulomb's) forces.

In FIG. 1, an edge ring, conductor ring, insulating materials around the electrostatic chuck 106, and other components thereof are omitted for clarity.

In use and operation, an etching gas composition may be provided to the chamber 102 through the gas supply line 114 and the apertures 116 of the gas distribution showerhead. The plasma may be generated by applying a high frequency (e.g., a frequency between about 13 MHz and about 300 MHz, such as between about 13.56 MHz and about 40.68 MHz, or a frequency of about 60 MHz) to the upper electrode 112.

A vacuum pump 136 may be coupled to a gas discharge line 138 for removing excess plasma and at least some reaction byproducts from the chamber 102. The vacuum pump 136 may be configured to control a pressure of the chamber 102 during the plasma etching process.

During processing (e.g., patterning) of the semiconductor wafer 110 to form, for example, one or more semiconductor devices, it may be desirable to maintain a temperature of one or more components of the tool 100 (e.g., the electrostatic chuck 106) at one or more desired temperatures. For example, during some stages of processing, such as during etching of the semiconductor wafer, it may be desired to maintain a relatively cold temperature (e.g., less than about 0° C., less than about −20° C., less than about −40° C., less than about −50° C., less than about −70° C., or less than about −100° C.) of at least one component within the tool 100 and during other stages of processing, such as during other etching acts, during cleaning acts, or during deposition acts, it may be desired to maintain a relatively hot temperature (e.g., greater than about 20° C., greater than about 40° C., greater than about 50° C., greater than about 70° C., or greater than about 100° C.) of the at least one component. Accordingly, over the course of processing of the semiconductor wafer 110, the semiconductor wafer 110 may repeatedly be exposed to cycles of relatively cold temperatures and relatively hot temperatures. By way of nonlimiting example, during some etching acts, it may be desirable to maintain the temperature of the electrostatic chuck 106 and the semiconductor wafer 110 as low as about −70° C. During cleaning of the tool 100 or during other etching acts, it may be desirable to maintain a temperature of the electrostatic chuck 106 and the semiconductor wafer 110 at a temperature greater than about 70° C. to facilitate sublimation of undesired etch byproducts that accumulate proximate the electrostatic chuck 106 (e.g., during dry cleaning of the tool 100).

Accordingly, in some embodiments, the electrostatic chuck 106 may be operably connected to a heating and cooling apparatus (e.g., a chiller, a heat exchanger) 130 configured to maintain a desired temperature of the electrostatic chuck 106. The temperature of the semiconductor wafer 110 may be maintained through thermal contact with the electrostatic chuck 106.

The heating and cooling apparatus 130 may include thermal transfer fluid supply piping 132 that passes through the electrostatic chuck 106 and thermal transfer fluid return piping 134 for returning a thermal transfer fluid to the heating and cooling apparatus 130. The thermal transfer fluid may include a fluid formulated and configured to maintain a temperature of the electrostatic chuck. For example, the thermal transfer fluid may be formulated to maintain a temperature of the electrostatic chuck 106 less than about −20° C., less than about −40° C., less than about −50° C., less than about −70° C., less than about −100° C., or even less than about −150° C. The thermal transfer fluid may also be formulated to maintain a temperature of the electrostatic chuck 106 greater than about 20° C., greater than about 40° C., greater than about 50° C., greater than about 70° C., greater than about 100° C., or even greater than about 150° C. Accordingly, the thermal transfer fluid may exhibit an operating window as large as about 40° C., as large as about 80° C., as large as about 100° C., as large as about 140° C., as large as about 200° C., or even as large as about 300° C. In other words, a temperature difference between the thermal transfer fluid used to maintain an elevated temperature of the electrostatic chuck 106 and the thermal transfer fluid used to maintain a lower temperature of the electrostatic chuck 106 may be as large as about 40° C., as large as about 80° C., as large as about 100° C., as large as about 140° C., as large as about 200° C., or even as large as about 300° C.

In some embodiments, the thermal transfer fluid may exhibit a liquid temperature range between at least about −70° C. and at least about 70° C., such as between about −100° C. and about 100° C. In some embodiments, a freezing point of the thermal transfer fluid may be less than about −70° C., less than about −80° C., less than about −90° C., less than about −100° C., less than about −120° C., or even less than about −150° C. In some embodiments, a boiling point of the thermal transfer fluid may be greater than about 70° C., greater than about 80° C., greater than about 90° C., greater than about 100° C., greater than about 120° C., or even greater than about 150° C.

In some embodiments, the thermal transfer fluid comprises a fluorocarbon-based fluid, such as, for example, perfluorohexane ($C_6F_{14}$), perfluoro(2-butyl-tetrahydrofurane), another fluorocarbon, one or more perfluorocarbons, one or more hydrofluoroethers (HFEs), one or more perfluorocarbon ethers (PFEs), or combinations thereof. In other embodiments, the thermal transfer fluid comprises a solution including ethylene glycol and water, a solution including propylene glycol and water, a solution including methanol and water, one or more aliphatic hydrocarbons (e.g., a polyalphaolefin (PAO)), a synthetic hydrocarbon (e.g., diethyl benzene (DEB), dibenzyl toluene, diaryl alkyl, partially hydrogenated terphenyl, etc.), a dimethyl phenyl-poly siloxane compound, a methyl phenyl-poly siloxane compound (also referred to as "silicon oil"), or combinations thereof.

Figure 2:
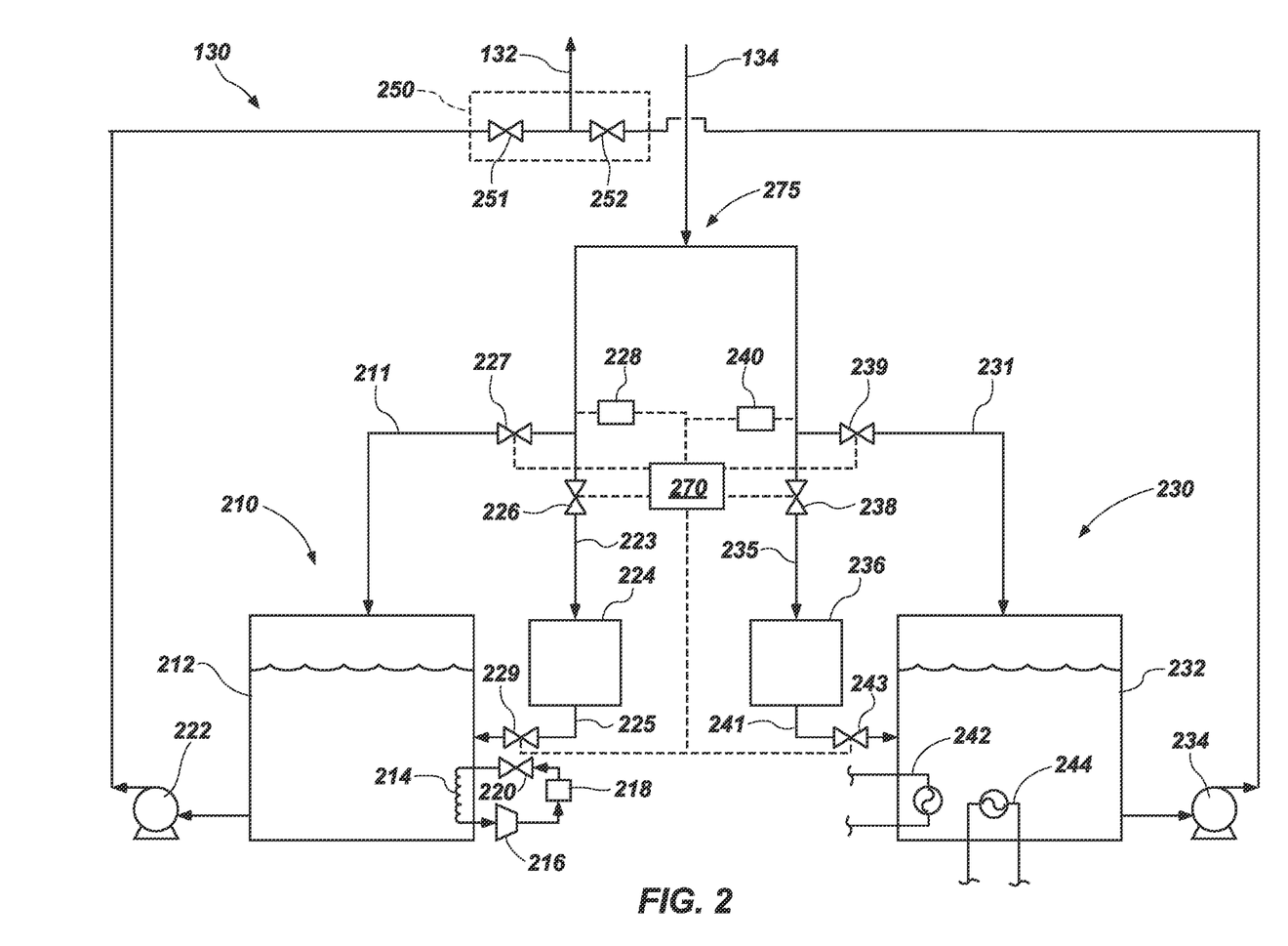
FIG. 2 is a simplified schematic of a heating and cooling apparatus of the tool, in accordance with embodiments of the disclosure.

FIG. 2 is a simplified schematic of the heating and cooling apparatus 130, in accordance with some embodiments of the disclosure. The heating and cooling apparatus 130 may include a cooling system 210 and a heating system 230. Each of the cooling system 210 and the heating system 230 may be in operable communication with a manifold 250 including valving and piping for directing the thermal transfer fluid between the electrostatic chuck 106 (FIG. 1) and each of the cooling system 210 and the heating system 230.

The manifold 250 may be in operable communication with the thermal transfer fluid supply piping 132 and the thermal transfer fluid return piping 134. As described with reference to FIG. 1, the thermal transfer fluid supply piping 132 and the thermal transfer fluid return piping 134 may be in operable communication with the electrostatic chuck 106 for controlling a temperature thereof.

The cooling system 210 may be configured to cool the thermal transfer fluid to a desired temperature (e.g., about −70° C.). The cooling system 210 may include, for example, a cold tank 212 configured to store the thermal transfer fluid. In some embodiments, the cold tank 212 may include the thermal transfer fluid. The thermal transfer fluid in the cold tank 212 may be at a relatively low temperature (relative to a temperature of the thermal transfer fluid in a hot tank 232) and may, therefore, be referred to herein as a "cold thermal transfer fluid." The thermal transfer fluid in the cold tank 212 may be cooled with a refrigerant in a first heat exchanger 214, which may comprise, for example, an evaporator. The refrigerant may pass from the first heat exchanger 214 to a compressor 216, from the compressor 216 to a condenser 218, and from the condenser to an expansion valve 220 to complete a refrigeration cycle. Accordingly, the cold thermal transfer fluid from the cold tank 212 may be cooled with the refrigerant in the refrigeration cycle. Although the cold thermal transfer fluid is shown as being cooled by a particular refrigeration cycle, the disclosure is not so limited and the cold thermal transfer fluid may be cooled by other means.

The cold thermal transfer fluid in the cold tank 212 may be in operable communication with a pump 222 configured to provide the cold thermal transfer fluid to the manifold 250 and to the electrostatic chuck 106 via the thermal transfer fluid supply piping 132. The cooling system 210 may further include a temporary tank (also referred to herein as a "temporary storage tank") 224 configured for storing a portion of the thermal transfer fluid of the heating and cooling system 130, as will be described herein. A volume of the temporary tank 224 may be between about 5.0% and about 20% a volume of the cold tank 212, such as between about 5.0% and about 10%, between about 10.0% and about 15.0%, or between about 15.0% and about 20.0% a volume of the cold tank 212.

The cold tank 212 and the temporary tank 224 may be configured to be in fluid communication with the thermal transfer fluid return piping 134. The temporary tank 224 may be configured to be in fluid communication with the thermal transfer fluid return piping 134 via a valve 226. The cold tank 212 may be configured to be in fluid communication with the thermal transfer fluid return piping 134 via a valve 227. As will be understood, operation of the valves 226, 227 may be used to direct the flow of thermal transfer fluid from the thermal transfer fluid return piping 134 to the cold tank 212 (e.g., through cold tank return piping 211) or to the temporary tank 224 (e.g., through temporary tank return piping 223). In some embodiments, a first temperature indicator 228 (e.g., temperature probe) may be located in the thermal transfer fluid return piping 134 and positioned to measure a temperature of the thermal transfer fluid proximate each of the valves 226, 227. The heating and cooling system 130 may include a controller 270 in operable communication with the valves 226, 227 and the first temperature indicator 228 and configured to open or close the valves 226, 227 based on a temperature measured by the first temperature indicator 228, as will be described herein.

Although FIG. 2 illustrates that the valves 226, 227 are separate and distinct, it is understood that the thermal transfer fluid return piping 134 may be configured to be placed in fluid communication with each of the cold tank return piping 211 and the temporary tank return piping 223 with, for example, a three-way valve. In other words, the valves 226, 227 may be replaced with a three-way valve.

The heating system 230 may be configured to heat the thermal transfer fluid to a desired temperature (e.g., about 70° C.). The heating system 230 may include, for example, a hot tank 232 configured to store the thermal transfer fluid. In some embodiments, the hot tank 232 may include the thermal transfer fluid. A temperature of the thermal transfer fluid in the hot tank 232 may be regulated with a second heat exchanger 242 or a cooler 244, depending on a desired temperature of the thermal transfer fluid in the hot tank 232. The thermal transfer fluid in the hot tank 232 may be at a relatively high temperature than the cold thermal transfer fluid in the cold tank 212 and may, therefore, be referred to herein as a "hot thermal transfer fluid." The second heat exchanger 242 may comprise, for example, an electric heater. In other embodiments, the second heat exchanger 242 may comprise a shell and tube heat exchanger including a heating fluid configured to provide thermal energy to the hot thermal transfer fluid stored within the hot tank 232. In some embodiments, the cooler 244 may be configured to lower a temperature of the thermal transfer fluid in the hot tank 232.

The hot thermal transfer fluid in the hot tank 232 may be in operable communication with a pump 234 configured to provide the hot thermal transfer fluid to the manifold 250 and to the electrostatic chuck 106 via the thermal transfer fluid supply piping 132. The heating system 230 may further include a temporary tank (also referring to herein as a "temporary storage tank") 236 configured for storing a portion of the thermal transfer fluid from the thermal transfer fluid return piping 134, as will be described herein. A volume of the temporary tank 236 may be between about 5.0% and about 20% a volume of the hot tank 232, such as between about 5.0% and about 10%, between about 10.0% and about 15.0%, or between about 15.0% and about 20.0% a volume of the cold tank 212.

The temporary tank 236 and the hot tank 232 may be configured to be in operable communication with the thermal transfer fluid return piping 134. The temporary tank 236 may be configured to be in fluid communication with the thermal transfer fluid return piping 134 via a valve 238 and the hot tank 232 may be configured to be in fluid communication with the thermal transfer fluid return piping 134 via a valve 239. As will be understood, operation of the valves 238, 239 may be used to direct the flow of thermal transfer fluid from the thermal transfer fluid return piping 134 to the hot tank 232 (e.g., through hot tank return piping 231) or to the temporary tank 236 (e.g., through temporary tank return piping 235). In some embodiments, a second temperature indicator (e.g., temperature probe) 240 may be located in the thermal transfer fluid return piping 134 and positioned to measure a temperature of the thermal transfer fluid proximate each of the valves 238, 239. The controller 270 may be in operable communication with the valves 238, 239 and configured to open or close the valves 238, 239 based on a temperature measured by the second temperature indicator 240, as will be described herein. As will be described herein, the valves 238, 239 may be configured to direct the thermal transfer fluid from the thermal transfer fluid return piping 134 to one of the temporary tank 236 or the hot tank 232 based on a temperature measured by the second temperature indicator 240.

Although FIG. 2 illustrates that the valves 238, 239 are separate and distinct, it is understood that the thermal transfer fluid return piping 134 may be configured to be placed in fluid communication with each of the hot tank return piping 231 and the temporary tank return piping 235 with, for example, a three-way valve.

Although FIG. 2 illustrates that the thermal transfer fluid return piping 134 includes the first temperature indicator 228 and the second temperature indicator 240, the disclosure is not so limited. In other embodiments, a single temperature indicator may be located and positioned in the thermal transfer fluid return piping 134 proximate a junction where the thermal transfer fluid return piping 134 splits toward the cooling system 210 and the heating system 230, as indicated at junction 275. In some such embodiments, a volume of the thermal transfer fluid return piping between the valves 226, 227 and the junction 275 and a volume of the thermal transfer fluid return piping 134 between the valves 238, 239 and the junction 275 may be less than about 10%, less than about 5%, or less than about 1% a total volume of the thermal transfer fluid return piping 134.

The first pump 222 and the second pump 234 may be configured to be in fluid communication with the thermal transfer fluid supply piping 132 via respective valves 251, 252. The valves 251, 252 may be manipulated to direct one of the cold thermal transfer fluid from the cold tank 212 or the hot thermal transfer fluid from the hot tank 232 to the electrostatic chuck 106 through the thermal transfer fluid supply piping 132. For example, when it is desired to maintain an elevated temperature of the electrostatic chuck 106, the valve 252 may be configured to direct the hot thermal transfer fluid from the hot tank 232 to the electrostatic chuck 106 while the valve 251 is closed. When it is desired to maintain a relatively lower temperature of the electrostatic chuck 106, valve 252 may be closed and the valve 251 may be opened to direct the cold thermal transfer fluid from the cold tank 212 to the electrostatic chuck 106. Although FIG. 2 illustrates that the valves 251, 252 are separate, the disclosure is not so limited. In other embodiments, a three-way valve may be configured to place the cold tank 212 in fluid communication with the thermal transfer fluid supply piping 132 or the hot tank 232 in fluid communication with the thermal transfer fluid supply piping 132.

In use and operation, when it is desired to maintain a relatively low temperature of the electrostatic chuck 106, the cold thermal transfer fluid from the cold tank 212 is circulated to the thermal transfer fluid supply piping 132 and to the electrostatic chuck 106. The cold thermal transfer fluid exchanges heat with the electrostatic chuck 106 and is returned to the cold tank 212 via the thermal transfer fluid return piping 134 and the cold tank return piping 211. While the cold thermal transfer fluid is circulated from the cold tank 212, the hot thermal transfer fluid in the hot tank 232 is uncirculated or is circulated in a separate loop bypassing the electrostatic chuck 106. When it is desired to heat the electrostatic chuck 106, circulation of the cold thermal transfer fluid from the cold tank 212 is stopped (e.g., the flow of the cold thermal transfer fluid is stopped or circulation of the cold thermal transfer fluid through the electrostatic chuck 106 is stopped and the cold thermal transfer fluid is circulated in a separate loop bypassing the electrostatic chuck 106) and the hot thermal transfer fluid from the hot tank 232 is circulated to the electrostatic chuck 106 and returned to the hot tank 232 via the thermal transfer fluid return piping 134 and the hot tank return piping 231.

During processing of a semiconductor wafer 110, the temperature of the electrostatic chuck 106 may be changed rapidly and frequently, depending on the particular process conditions within the tool 100. As described above, when the temperature requirements of the electrostatic chuck 106 change, circulation of the thermal transfer fluid supplied to the electrostatic chuck 106 is switched from one of the cooling system 210 or the heating system 230 to the other of the cooling system 210 or the heating system 230. In conventional systems, when the circulation of the thermal transfer fluid is switched from one of the cold tank 212 or the hot tank 232 to the other of the cold tank 212 or the hot tank 232, the thermal transfer fluid in the thermal transfer fluid supply piping 132, the electrostatic chuck 106, and the thermal transfer fluid return piping 134 remains at the temperature from which the thermal load is changed and is returned to the tank from which the thermal transfer fluid is circulated. In other words, and as one example, when circulation of the thermal transfer fluid changes from the cold tank 212 to the hot tank 232, the cold thermal transfer fluid remaining in the thermal transfer fluid supply piping 132, the electrostatic chuck 106, and the thermal transfer fluid return piping 134 (e.g., a surge volume of the thermal transfer fluid) is returned to the hot tank 232.

Where a temperature difference between the cold tank 212 and the hot tank 232 is more than about, for example 50° C., such as more than about 70° C., more than about 100° C., more than about 120° C., more than about 140° C., or even more than about 200° C., the surge volume of thermal transfer fluid returned to the cold tank 212 or the hot tank 232 responsive to switching the thermal load from the hot tank 232 or cold tank 212, respectively, when the thermal transfer load at the electrostatic chuck 106 is switched may cause an undesired deviation in the temperature of the thermal transfer fluid in the respective cold tank 212 or hot tank 232.

Accordingly, in some embodiments, the cooling system 210 includes the temporary storage tank 224 and the heating system 230 includes the temporary storage tank 236 configured to receive the surge volume of thermal transfer fluid when the thermal load on the electrostatic chuck 106 is switched. As will be described herein, in some embodiments, the heating and cooling apparatus 130 is configured to transfer thermal transfer fluid stored in the temporary tank 224 to the cold tank 212 when the thermal load from the electrostatic chuck 106 is on the heating system 230. For example, temporary tank return piping 225 may be configured to place the temporary tank 224 in fluid communication with the cold tank 212 via a valve 229. Similarly, the heating and cooling apparatus 130 may be configured to transfer the thermal transfer fluid from the temporary tank 236 to the hot tank 232 when the thermal load from the electrostatic chuck 106 is on the cooling system 210. For example, temporary tank return piping 241 may be configured to place the temporary tank 236 in fluid communication with the hot tank 232 via a valve 243.

Figure 3:
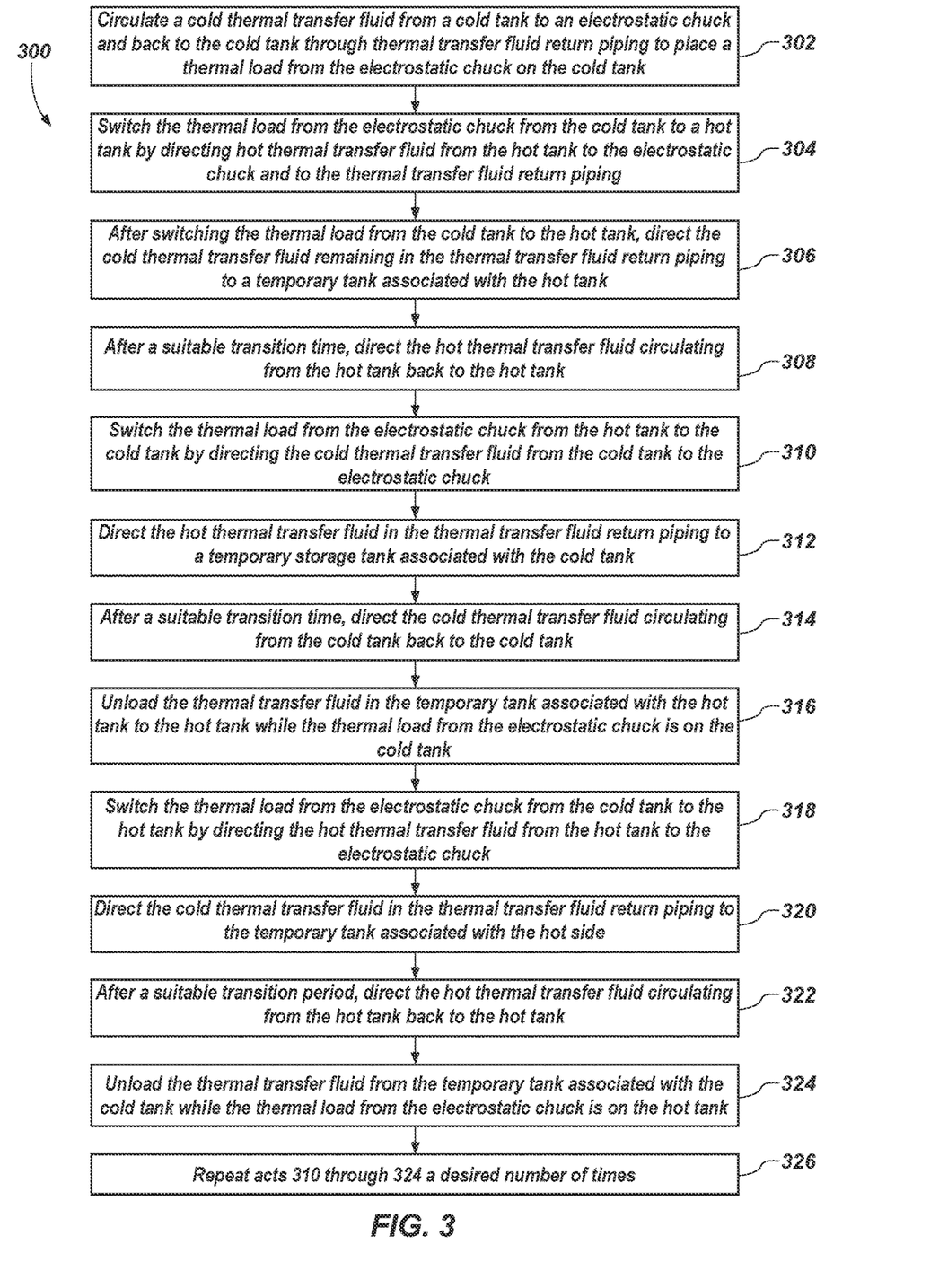
FIG. 3 is a simplified flow diagram of a method of maintaining a temperature of a tool used during processing of a semiconductor wafer, in accordance with embodiments of the disclosure.

FIG. 3 is a simplified flow diagram of a method 300 of operating the heating and cooling apparatus 130, in accordance with some embodiments of the disclosure. The method 300 includes act 302 including circulating a cold thermal transfer fluid from a cold tank to an electrostatic chuck and back to the cold tank through thermal transfer fluid return piping to place a thermal load from the electrostatic chuck on the cold tank; act 304 including switching the thermal load from the electrostatic chuck from the cold tank to a hot tank by directing hot thermal transfer fluid from the hot tank to the electrostatic chuck and to the thermal transfer fluid return piping; act 306 including, after switching the thermal load from the cold tank to the hot tank, directing the cold thermal transfer fluid remaining in the thermal transfer fluid return piping to a temporary tank associated with the hot tank; act 308 including, after a suitable transition time, directing the hot thermal transfer fluid circulating from the hot tank back to the hot tank; act 310 including switching the thermal load from the electrostatic chuck from the hot tank to the cold tank by directing the cold thermal transfer fluid from the cold tank to the electrostatic chuck; act 312 including directing the hot thermal transfer fluid in the thermal transfer fluid return piping to a temporary storage tank associated with the cold tank; act 314 including, after a suitable transition time, directing the cold thermal transfer fluid circulating from the cold tank back to the cold tank; act 316 including unloading the thermal transfer fluid in the temporary tank associated with the hot tank to the hot tank while the thermal load from the electrostatic chuck is on the cold tank; act 318 including switching the thermal load from the electrostatic chuck from the cold tank to the hot tank by directing the hot thermal transfer fluid from the hot tank to the electrostatic chuck; act 320 including directing the cold thermal transfer fluid in the thermal transfer fluid return piping to the temporary storage tank associated with the hot side; act 322 including, after a suitable transition period, directing the hot thermal transfer fluid circulating from the hot tank back to the hot tank; act 324 including unloading the thermal transfer fluid from the temporary tank associated with the cold tank while the thermal load from the electrostatic chuck is on the hot tank; and act 326 including repeating acts 310 through 324 a desired number of times.

With reference to FIG. 1 through FIG. 3, act 302 includes circulating a cold thermal transfer fluid from a cold tank to an electrostatic chuck to place a thermal load from the electrostatic chuck on the cold tank. By way of example, and with reference to FIG. 2, act 302 may include circulating the cold thermal transfer fluid from the cold tank 212 to the electrostatic chuck 106 via the thermal transfer fluid supply piping 132 and back to the cold tank 212 via the thermal transfer fluid return piping 134. The cold thermal transfer fluid may lower a temperature of the electrostatic chuck 106 during circulation thereof. While the cold thermal transfer fluid is circulated from the cold tank 212, the hot thermal transfer fluid in the hot tank 232 may not be circulated or may be circulated in a closed loop wherein the electrostatic chuck 106 is bypassed.

Act 304 includes switching the thermal load from the electrostatic chuck from the cold tank to a hot tank by directing hot thermal transfer fluid from the hot tank to the electrostatic chuck and to the thermal transfer fluid return piping. For example, circulation of the cold thermal transfer fluid to the electrostatic chuck 106 from the cold tank 212 may be stopped by closing the valve 251 in fluid communication with the cold tank 212 and opening the valve 252 in fluid communication with the hot tank 232. Similarly, the valve 227 in fluid communication with a cold tank return piping 211 may be closed and the heating system 230 may be placed in fluid communication with the thermal transfer fluid return piping 134. Accordingly, the hot thermal transfer fluid may be circulated from the hot tank 232 to the electrostatic chuck 106. Switching the thermal load from the electrostatic chuck 106 from the cold tank 212 to the hot tank 232 may include increasing the temperature of the electrostatic chuck 106.

Act 306 includes, after switching the thermal load from the cold tank to the hot tank, directing the cold thermal transfer fluid remaining in the thermal transfer fluid return piping to a temporary tank associated with the hot tank. In some embodiments, act 306 may be performed substantially simultaneously or immediately after act 304. For example, after the thermal load from the electrostatic chuck 106 is switched from the cold tank 212 to the hot tank 232, the cold thermal transfer fluid that was circulated during act 302 may remain in the thermal transfer fluid supply piping 132, the electrostatic chuck 106, and the thermal transfer fluid return piping 134. When the thermal load from the electrostatic chuck 106 is switched from the cold tank 212 to the hot tank 232, the hot thermal transfer fluid is circulated to the electrostatic chuck 106 and the cold thermal transfer fluid remaining in thermal transfer fluid supply piping 132, the electrostatic chuck 106, and the thermal transfer fluid return piping 134 may be directed to the temporary tank 236 until the temperature of the thermal transfer fluid in the thermal transfer fluid return piping 134 reaches a desired temperature (e.g., such that the cold thermal transfer fluid is substantially flushed from the thermal transfer fluid return piping 134).

Act 308 may include, after a suitable transition time, directing the hot thermal transfer fluid circulating from the hot tank back to the hot tank. For example, after a sufficient duration, the hot thermal transfer fluid in the thermal transfer fluid return piping 134 may be directed to the hot tank 232 rather than to the temporary tank 236. In some embodiments, the valve 238 may be closed to stop a flow of the hot thermal transfer fluid to the temporary tank 236 and the valve 239 may be opened to direct the flow of the hot thermal transfer fluid to the hot tank 232. In some embodiments, the valves 238, 239 may be in operable communication with the temperature indicator 240 and the controller 270. In some such embodiments, the controller 270 may be configured to direct the hot thermal transfer fluid to the hot tank 232 responsive to measuring a temperature of the hot thermal transfer fluid proximate the temperature indicator 240 greater than a predetermined temperature by manipulation of the valves 238, 239 (i.e., opening the valve 239 and closing the valve 238). In other embodiments, if a temperature difference between the hot thermal transfer fluid in the hot tank 232 and the hot thermal transfer fluid proximate the valves 238, 239 is less than a predetermined value, the controller 270 may be configured to direct the hot thermal transfer fluid to the hot tank 232. By way of nonlimiting example, if the temperature difference between the hot thermal transfer fluid in the hot tank 232 and the hot thermal transfer fluid in the thermal transfer fluid return piping 134 is less than about 10° C., less than about 5° C., or less than about 2° C., the valve 239 may be opened and the valve 238 may be closed to direct the thermal transfer fluid to the hot tank 232 rather than to the temporary tank 236. In other embodiments, the controller 270 may be configured to direct the hot thermal transfer fluid in the thermal transfer fluid return piping 134 to the hot tank 232 after a predetermined duration after which the thermal load from the electrostatic chuck 106 is switched from the cold tank 212 to the hot tank 232. In some embodiments, the duration may be between about 1 second and about 5 seconds, between about 5 seconds and about 10 seconds, between about 10 seconds and about 20 seconds, or between about 20 seconds and about 30 seconds. However, the disclosure is not so limited and the duration may be greater depending on the length of the thermal transfer fluid supply piping 132 and the thermal transfer fluid return piping 134.

Act 310 includes switching the thermal load from the electrostatic chuck from the hot tank to the cold tank by directing the cold thermal transfer fluid from the cold tank to the electrostatic chuck. Switching the thermal load from the electrostatic chuck 106 from the hot tank 232 to the cold tank 212 may include stopping circulation of the hot thermal transfer fluid from the hot tank 232 to the electrostatic chuck 106 and circulating the cold thermal transfer fluid from the cold tank 212 to the electrostatic chuck 106. By way of nonlimiting example, circulation of the hot thermal transfer fluid to the electrostatic chuck 106 may be stopped by closing the valve 252 and opening the valve 251.

Act 312 includes directing the thermal transfer fluid in the thermal transfer fluid return piping to a temporary storage tank associated with the cold tank. In some embodiments, act 312 may be performed substantially simultaneously or immediately after act 310. For example, after the thermal load from the electrostatic chuck 106 is switched from the hot tank 232 to the cold tank 212, the hot thermal transfer fluid may remain in the thermal transfer fluid supply piping 132, the electrostatic chuck 106, and the thermal transfer fluid return piping 134. When the cold thermal transfer fluid is circulated to the electrostatic chuck 106, the hot thermal transfer fluid remaining in the thermal transfer fluid supply piping 132, the electrostatic chuck 106, and the thermal transfer fluid return piping 134 may be directed to the temporary tank 224 for a duration until the temperature of the cold thermal transfer fluid in the thermal transfer fluid return piping 134 reaches equilibrium (e.g., such that the hot thermal transfer fluid is substantially flushed from the thermal transfer fluid return piping 134).

Act 314 may include, after a suitable transition time, directing the cold thermal transfer fluid circulating from the cold tank back to the cold tank. For example, after a sufficient duration, the cold thermal transfer fluid in the thermal transfer fluid return piping 134 may be directed to the cold tank 212 rather than to the temporary tank 224. In some embodiments, the valve 226 may be closed to stop a flow of the cold thermal transfer fluid to the temporary tank 224 and the valve 227 may be opened to direct the flow of the cold thermal transfer fluid to the cold tank 212.

In some embodiments, the controller 270 may be in operable communication with the temperature indicator 228 and the valves 226, 227. In some such embodiments, the controller 270 may be configured to open the valve 227 and close the valve 226 (i.e., direct the cold thermal transfer fluid to the cold tank 212) responsive to measuring a temperature of the cold thermal transfer fluid proximate the temperature indicator 228 less than a predetermined temperature. In other embodiments, if a temperature difference between the cold thermal transfer fluid in the cold tank 212 and the cold thermal transfer fluid proximate the valves 226, 227 is less than a predetermined value, the controller 270 may be configured to direct the cold thermal transfer fluid to the cold tank 212. By way of nonlimiting example, if the temperature difference is less than about 10° C., less than about 5° C., or less than about 2° C., the controller 270 may direct the thermal transfer fluid to the cold tank 212 rather than to the temporary tank 224. In other embodiments, the controller 270 may be configured to direct the cold thermal transfer fluid in the thermal transfer fluid return piping 134 to the cold tank 212 after a predetermined duration after which the thermal load from the electrostatic chuck 106 is switched from the hot side to the cold side. In some embodiments, the duration may be between about 1 second and about 5 seconds, between about 5 seconds and about 10 seconds, between about 10 seconds and about 20 seconds, or between about 20 seconds and about 30 seconds. However, the disclosure is not so limited and the duration may be greater depending on the length of the thermal transfer fluid supply piping 132 and the thermal transfer fluid return piping 134.

Act 316 includes unloading the thermal transfer fluid in the temporary tank associated with the hot tank to the hot tank while the thermal load from the electrostatic chuck is on the cold tank. In some embodiments, act 316 is performed substantially simultaneously with act 312, act 314, or both. The controller 270 may be in operable communication with the valve 243 and configured to open the valve 243 when the thermal load from the electrostatic chuck 106 is on the cold tank 212. In some embodiments, the valve 243 is opened and the thermal transfer fluid in the temporary tank 236 is gravity fed to the hot tank 232. In other embodiments, the thermal transfer fluid in the temporary tank 236 is pumped to the hot tank 232 in a controlled manner (e.g., 0.5 L/min, 1.0 L/min, 2.0 L/min, etc.) such as through a flow restrictor. By way of nonlimiting example, the thermal transfer fluid in the temporary tank 236 may be removed from the temporary tank 236 over a predetermined duration (e.g., 30 seconds, 1 minute, 2 minutes, etc.). Since the thermal load from the electrostatic chuck 106 is on the cold side of the heating and cooling apparatus 130 while the thermal transfer fluid in the temporary tank 236 is flowed to the hot tank 232, the temperature of the electrostatic chuck 106 is not effected by the thermal transfer fluid from the temporary tank 236 entering the hot tank 232.

Act 318 includes switching the thermal load from the electrostatic chuck from the cold tank to the hot tank by directing the hot thermal transfer fluid from the hot tank to the electrostatic chuck. Switching the thermal load from the electrostatic chuck 106 from the cold tank 212 to the hot tank 232 may include stopping circulation of the cold thermal transfer fluid from the cold tank 212 to the electrostatic chuck 106 and circulating the hot thermal transfer fluid from the hot tank 232 to the electrostatic chuck 106 and may be substantially similar to act 304 described above.

Act 320 includes directing the cold thermal transfer fluid in the thermal transfer fluid return piping to the temporary tank associated with the hot side. In some embodiments, act 320 may be substantially similar to act 306 described above.

Act 322 includes, after a suitable transition period, directing the hot thermal transfer fluid circulating from the hot tank back to the hot tank. In some embodiments, act 322 is substantially similar to act 308.

Act 324 includes unloading the thermal transfer fluid from the temporary tank associated with the cold tank while the thermal load from the electrostatic chuck is on the hot tank. In some embodiments, act 324 is performed substantially simultaneously with act 320, act 322, or both. By way of nonlimiting example, the thermal transfer fluid in the temporary tank 224 may be transferred to the cold tank 212 by opening the valve 229. The controller 270 may be configured to open the valve 229 when the thermal load from the electrostatic chuck 106 is on the hot tank 232. In some embodiments, the valve 229 is opened and the hot thermal transfer fluid in the temporary tank 224 is gravity fed to the cold tank 212. In other embodiments, the thermal transfer fluid is pumped to the cold tank 212 in a controlled manner (e.g., about 0.5 L/min, about 1.0 L/min, about 2.0 L/min, etc.), such as through a flow restrictor. In yet other embodiments, the thermal transfer fluid in the temporary tank 224 is removed therefrom over a predetermined duration (e.g., about 30 seconds, about 1 minute, about 2 minutes, etc.). Since the thermal load from the electrostatic chuck 106 is on the hot side of the heating and cooling apparatus 130 while the thermal transfer fluid in the temporary tank 224 is flowed to the cold tank 212, the temperature of the electrostatic chuck 106 is not effected by the thermal transfer fluid from the temporary tank 224 entering the cold tank 212.

Act 326 include repeating acts 310 through 324 a desired number of times. For example, acts 310 through 324 may be repeated until a semiconductor wafer is patterned and the tool 100 is cleaned.

Accordingly, the temporary tank 224 and the temporary tank 236 may be configured to store a thermal transfer fluid having a different temperature than the thermal transfer fluid of the respective cold tank 212 and hot tank 232 to prevent a spike in a temperature of the respective cold thermal transfer fluid and hot thermal transfer fluid. When the thermal load on the electrostatic chuck 106 is on the cold side, the thermal transfer fluid from the temporary tank 236 may be drained into the hot tank 232 and the temperature of the hot thermal transfer fluid may be equilibrated (e.g., brought to a set point). Similarly, while the thermal load on the electrostatic chuck 106 is on the hot side, the thermal transfer fluid in the temporary tank 224 may be drained to the cold tank 212 and the temperature of the cold thermal transfer fluid may be equilibrated. Since the thermal transfer fluid in the thermal transfer fluid supply piping 132, the electrostatic chuck 106, and the thermal transfer fluid return piping 134 is directed to one of the temporary tanks 224, 236 responsive to switching the thermal load from one of the cold tank 212 or the hot tank 232 to the other of the cold tank 212 or the hot tank 232, the heating and cooling apparatus 130 may be configured to maintain a desired temperature of the cold thermal transfer fluid in the cold tank 212 and the hot thermal transfer fluid in the hot tank 232 in less than a predetermined time, such as less than about 2 minutes, less than about 1 minute, or even less than about 30 seconds.

Although FIG. 1 through FIG. 3 have been described and illustrated as including the electrostatic chuck 106 and the thermal load has been described in terms of the electrostatic chuck 106, the disclosure is not so limited. It will be understood that the thermal load may be placed on a platform to be heated and cooled and the thermal transfer fluid may be circulated through the platform.

Figure 4:
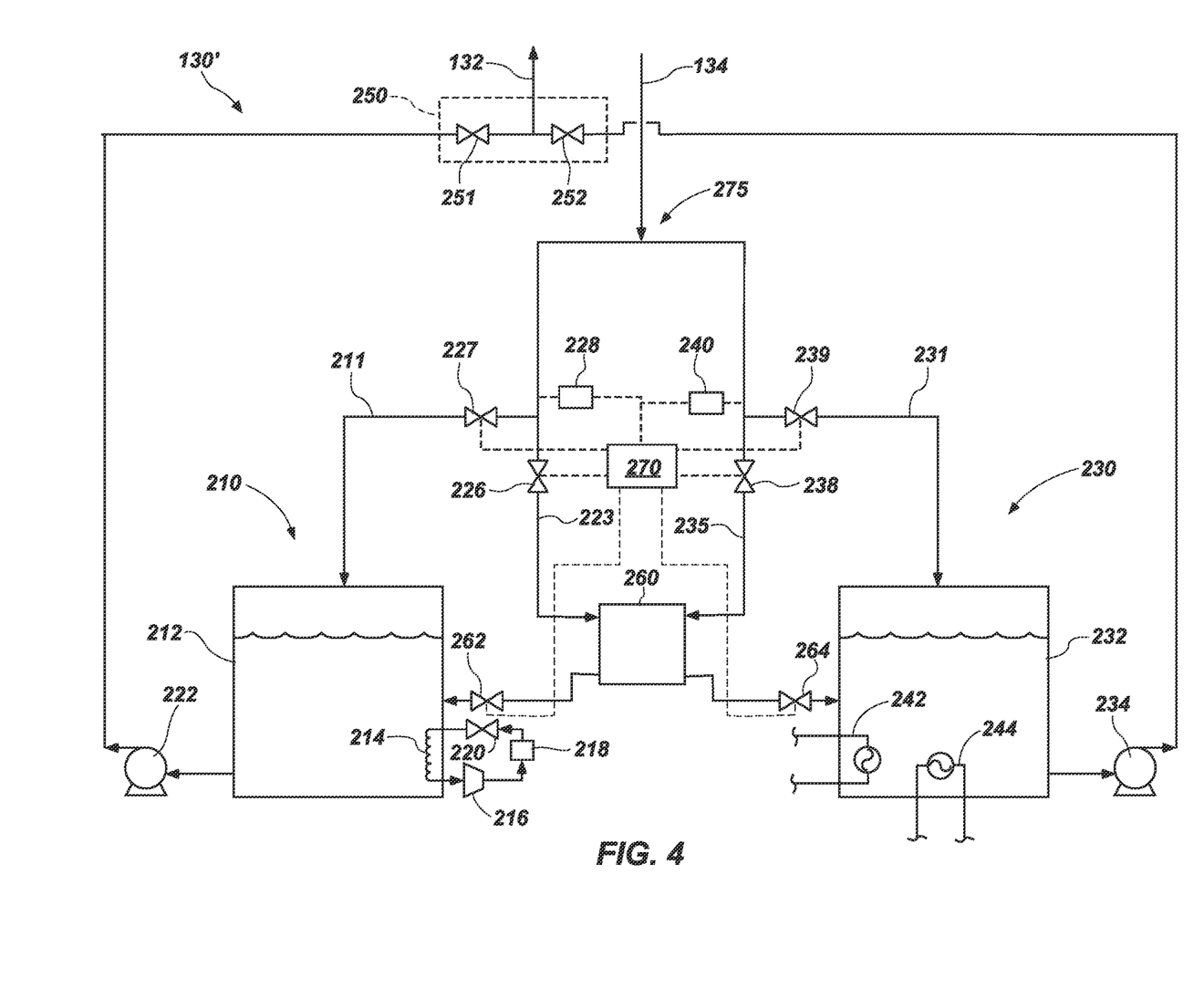
FIG. 4 is a simplified schematic of a heating and cooling apparatus of the tool, in accordance with other embodiments of the disclosure.

FIG. 4 is a simplified schematic of a heating and cooling system 130' in accordance with other embodiments of the disclosure. The heating and cooling system 130' may be substantially similar to the heating and cooling system 130 described above with reference to FIG. 2, except that the heating and cooling system 130' may not include a separate temporary tank for each of the cooling system 210 and the heating system 230. Rather, the heating and cooling system 130' may include a common temporary tank 260 which may be configured to be in fluid communication with each of the cold tank 212 and the hot tank 232. The common temporary tank 260 may be configured to receive the thermal transfer fluid located in the thermal transfer fluid supply piping 132, the thermal transfer fluid return piping 134, and the electrostatic chuck 106 after switching the thermal load on the electrostatic chuck 106 from one of the cooling system 210 and the heating system 230 to the other of the cooling system 210 and the heating system 230. The common temporary tank 260 may be configured to be in fluid communication with the cold tank 212 and with the hot tank 232. A valve 262 may be configured to direct a flow from the temporary tank 260 to the cold tank 212 when open and stop such a flow when closed. A valve 264 may be configured to direct a flow from the temporary tank 260 to the hot tank 232 when opened and stop such a flow when closed.

Figure 5:
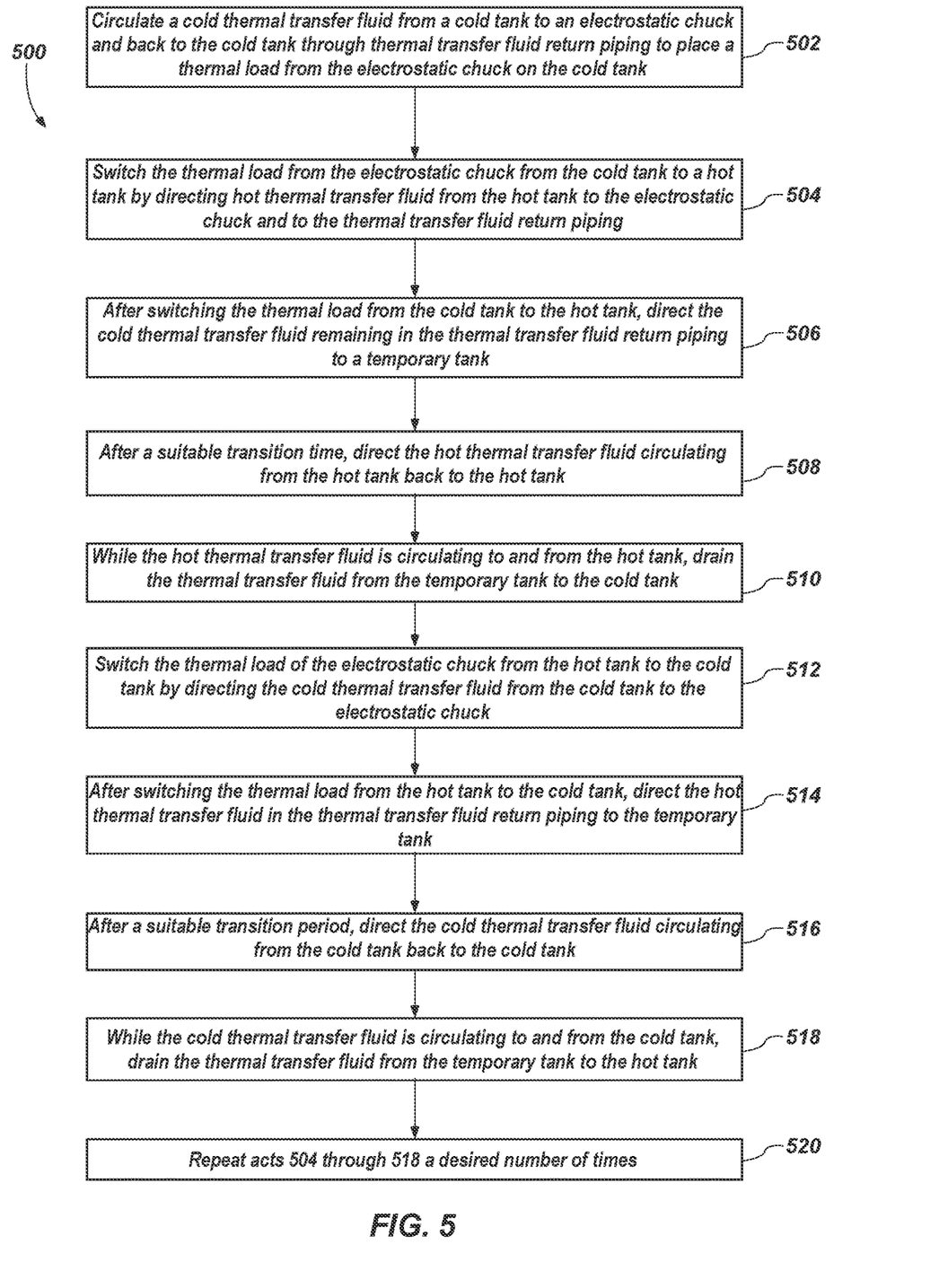
FIG. 5 is a simplified flow diagram of a method of maintaining a temperature of a tool used during processing of a semiconductor wafer, in accordance with other embodiments of the disclosure.

FIG. 5 is a simplified flow diagram of a method 500 of operating the heating and cooling apparatus 130', in accordance with some embodiments of the disclosure. The method 500 may include act 502 including circulating a cold thermal transfer fluid from a cold tank to an electrostatic chuck and back to the cold tank through thermal transfer fluid return piping to place a thermal load from the electrostatic chuck on the cold tank; act 504 including switching the thermal load from the electrostatic chuck from the cold tank to a hot tank by directed hot thermal transfer fluid from the hot tank to the electrostatic chuck and to the thermal transfer fluid return piping; act 506 including, after switching the thermal load from the cold tank to the hot tank, directing the cold thermal transfer fluid remaining in the thermal transfer fluid return piping to a temporary tank; act 508 including, after a suitable transition time, directing the hot thermal transfer fluid circulating from the hot tank back to the hot tank; act 510 including, while the hot thermal transfer fluid is circulating to and from the hot tank, draining the thermal transfer fluid from the temporary tank to the cold tank; act 512 including switching the thermal load of the electrostatic chuck from the hot tank to the cold tank by directing the cold thermal transfer fluid from the cold tank to the electrostatic chuck; act 514 including, after switching the thermal load from the hot tank to the cold tank, directing the hot thermal transfer fluid in the thermal transfer fluid return piping to the temporary tank; act 516 including, after a suitable transition time, directing the cold thermal transfer fluid circulating from the cold tank back to the cold tank; act 518 including, while the cold thermal transfer fluid is circulating to and from the cold tank, draining the thermal transfer fluid from the temporary tank to the hot tank; and act 520 including repeating acts 504 through 518 a desired number of times.

With reference to FIG. 4 and FIG. 5, act 502 includes circulating a cold thermal transfer fluid from a cold tank to an electrostatic chuck and back to the cold tank through thermal transfer fluid return piping to place a thermal load from the electrostatic chuck on the cold tank. Act 502 may be substantially similar to act 302 described above with reference to FIG. 3. During act 502, there is no thermal load from the electrostatic chuck 106 on the hot side.

Act 504 includes switching the thermal load from the electrostatic chuck from the cold tank to a hot tank by directing hot thermal transfer fluid from the hot tank to the electrostatic chuck and to the thermal transfer fluid return piping. Act 504 may be substantially similar to act 304 described above with reference to FIG. 3.

Act 506 includes after switching the thermal load from the electrostatic chuck from the cold tank to the hot tank, directing the cold thermal transfer fluid remaining in the thermal transfer fluid return piping to a temporary tank. For example, after switching the thermal load of the electrostatic chuck 106 from the cold tank 212 to the hot tank 232, the thermal transfer fluid supply piping 132, the electrostatic chuck 106, and the thermal transfer fluid return piping 134 may be filled with the cold thermal transfer fluid. The cold thermal transfer fluid in such piping may be directed to the temporary tank 260 for a predetermined duration during an initial period of circulation of the hot thermal transfer fluid. By way of nonlimiting example, the valve 238 may be opened and the valve 239 may be closed to direct the thermal transfer fluid in the thermal transfer fluid return piping 134 to the temporary tank 260. The temporary tank 260 may be at least partially filled with the cold thermal transfer fluid during act 506.

Act 508 includes, after a suitable transition time, directing the hot thermal transfer fluid circulating from the hot tank back to the hot tank. By way of nonlimiting example, the valve 239 may be opened and the valve 238 may be closed to direct the fluid in the thermal transfer fluid return piping 134 to the hot tank 232.

In some embodiments, the valve 238 and the valve 239 may be in operable communication with the temperature indicator 240 and with the controller 270. In some such embodiments, the controller 270 may be configured to direct the hot thermal transfer fluid to the hot tank 232 (i.e., open the valve 239) responsive to measuring a temperature of the hot thermal transfer fluid proximate the temperature indicator 240 greater than a predetermined temperature. In other embodiments, if a temperature difference between the hot thermal transfer fluid in the hot tank 232 and the hot thermal transfer fluid measured by the temperature indicator 240 is less than a predetermined value, the controller 270 may be configured to open the valve 239 to direct the hot thermal transfer fluid to the hot tank 232. By way of nonlimiting example, if the temperature difference is less than about 10° C., less than about 5° C., or less than about 2° C., the controller 270 may direct the hot thermal transfer fluid to the hot tank 232 rather than to the temporary tank 260. In other embodiments, the controller 270 may be configured to direct the hot thermal transfer fluid in the thermal transfer fluid return piping 134 to the hot tank 232 after a predetermined duration after which the thermal load from the electrostatic chuck 106 is switched from the cold side to the hot side. In some embodiments, the duration may be between 1 second and about 5 seconds, between about 5 seconds and about 10 seconds, between about 10 seconds and about 20 seconds, or between about 20 seconds and about 30 seconds. However, the disclosure is not so limited and the duration may be greater depending on the length of the thermal transfer fluid supply piping 132 and the thermal transfer fluid return piping 134.

Act 510 includes while the hot thermal transfer fluid is circulated to and from the hot tank, draining the thermal transfer fluid from the temporary tank to the cold tank. After the hot thermal transfer fluid is directed to the hot tank 232 and the temporary tank 260 is out of fluid communication with the thermal transfer fluid return piping 134, the valve 262 may be opened to direct the cold thermal transfer fluid in the temporary tank 260 to the cold tank 212. In some embodiments, the cold thermal transfer fluid in the temporary tank 260 is gravity fed to the cold tank 212. In other embodiments, the cold thermal transfer fluid is pumped to the cold tank 212 in a controlled manner (e.g., about 0.5 L/min, about 1.0 L/min, about 2.0 L/min, etc.), such as through a flow restrictor. In yet other embodiments, the cold thermal transfer fluid in the temporary tank 260 is removed therefrom over a predetermined duration (e.g., about 30 seconds, about 1 minute, about 2 minutes, etc.). Since the thermal load from the electrostatic chuck 106 is on the hot side of the heating and cooling apparatus 130 while the cold thermal transfer fluid in the temporary tank 260 is flowed to the cold tank 212, the temperature of the electrostatic chuck 106 is not effected by the cold thermal transfer fluid from the temporary tank 260 entering the cold tank 212 and the tank from which the thermal transfer fluid is circulating to the electrostatic chuck 106 is not affected. The cold thermal transfer fluid from the temporary tank 260 may be substantially completely removed from the temporary tank 260.

Act 512 includes switching the thermal load of the electrostatic chuck from the hot tank to the cold tank by directing the cold thermal transfer fluid from the cold tank to the electrostatic chuck. In some embodiments, act 512 is substantially similar to act 310 described above with reference to FIG. 3.

Act 514 includes, after switching the thermal load from hot tank to the cold tank, directing the hot thermal transfer fluid in the thermal transfer fluid return piping to the temporary tank. For example, after switching the thermal load of the electrostatic chuck 106 from the hot tank 232 to the cold tank 212, the thermal transfer fluid supply piping 132, the electrostatic chuck 106, and the thermal transfer fluid return piping 134 may be filled with the hot thermal transfer fluid. The hot thermal transfer fluid in such piping may be directed to the temporary tank 260 for a predetermined duration during an initial period of circulation of the cold thermal transfer fluid. By way of nonlimiting example, the valve 226 may be opened and the valve 227 may be closed to direct the fluid in the thermal transfer fluid return piping 134 to the temporary tank 260. The temporary tank 260 may be at least partially filled with the hot thermal transfer fluid during act 514.

Act 516 includes, after a suitable transition time, directing the cold thermal transfer fluid circulating from the cold tank back to the cold tank. By way of nonlimiting example, the valve 226 may be closed and the valve 227 may be opened to direct the cold thermal transfer fluid in the thermal transfer fluid return piping 134 to the cold tank 212.

In some embodiments, the valve 226 and the valve 227 may be in operable communication with the controller 270. In some such embodiments, the controller 270 may be configured to direct the cold thermal transfer fluid to the cold tank 212 (i.e., open the valve 227) responsive to measuring a temperature of the cold thermal transfer fluid proximate the temperature indicator 228 greater than a predetermined temperature. In other embodiments, if a temperature difference between the cold thermal transfer fluid in the cold tank 212 and the cold thermal transfer fluid measured by the temperature indicator 228 is less than a predetermined value, the controller 270 may be configured to open the valve 227 to direct the cold thermal transfer fluid to the cold tank 212. By way of nonlimiting example, if the temperature difference is less than about 10° C., less than about 5° C., or less than about 2° C., the controller 270 may be configured to direct the cold thermal transfer fluid to the cold tank 212 rather than to the temporary tank 260. In other embodiments, the controller 270 may be configured to direct the cold thermal transfer fluid in the thermal transfer fluid return piping 134 to the cold tank 212 after a predetermined duration after which the thermal load from the electrostatic chuck 106 is switched from the hot side to the cold side. In some embodiments, the duration may be between about 1 second and about 5 seconds, between about 5 seconds and about 10 seconds, between about 10 seconds and about 20 seconds, or between about 20 seconds and about 30 seconds. However, the disclosure is not so limited and the duration may be greater depending on the length of the thermal transfer fluid supply piping 132 and the thermal transfer fluid return piping 134.

Act 518 includes, while the cold thermal transfer fluid is circulating to and from the cold tank, draining the thermal transfer fluid in the temporary tank to the hot tank. After the cold thermal transfer fluid is directed to the cold tank 212 and the temporary tank 260 is out of fluid communication with the thermal transfer fluid return piping 134, the valve 264 may be opened to direct the hot thermal transfer fluid in the temporary tank to the hot tank 232. In some embodiments, the hot thermal transfer fluid in the temporary tank 260 is gravity fed to the hot tank 232. In other embodiments, the hot thermal transfer fluid is pumped to the hot tank 232 in a controlled manner (e.g., about 0.5 L/min, about 1.0 L/min, about 2.0 L/min, etc.), such as through a flow restrictor. In yet other embodiments, the hot thermal transfer fluid in the temporary tank is removed therefrom over a predetermined duration (e.g., about 30 seconds, about 1 minute, about 2 minutes, etc.). Since the thermal load from the electrostatic chuck 106 is on the cold tank 212 while the hot thermal transfer fluid in the temporary tank 260 is flowed to the hot tank 232, the temperature of the electrostatic chuck 106 is not effected by the hot thermal transfer fluid in the temporary tank 260 entering the hot tank 232 from which the thermal transfer fluid is circulating to the electrostatic chuck 106 is not affected. The hot thermal transfer fluid from the temporary tank 260 may be substantially completely removed from the temporary tank.

Act 520 includes repeating acts 504 through 518 a desired number of times. For example, acts 504 through 518 may be repeated until a semiconductor wafer is patterned and the tool 100 is cleaned.

Accordingly, a temperature of the electrostatic chuck 106 may be maintained without large temperature swings in the temperature of the cold tank 212 or the hot tank 232 since surge volumes of thermal transfer fluid having a substantially different temperature than the temperature of the thermal transfer fluid in the cold tank 212 or the hot tank 232 are not placed on such tanks. In addition, since the surge volume of the thermal transfer fluid is stored in a temporary tank and unloaded to the cold tank 212 or the hot tank 232 while the thermal load is away from such cold tank 212 or hot tank 232, the respective tanks may not exhibit a surge in temperature while the thermal load is placed thereon, increasing the effectiveness of the thermal transfer with the electrostatic chuck 106.

Although FIG. 1 through FIG. 5 have been described as controlling the temperature of the electrostatic chuck 106 during etching and cleaning acts, the disclosure is not so limited. In other embodiments, the temperature of a chamber may be controlled according to the methods described herein in any process in which it is desired to control a temperature of the chamber between at least two temperatures having a temperature difference greater than, for example, about 50° C. in a relatively short duration. By way of nonlimiting example, the methods described above (e.g., the method 300 and the method 500) may be used for sublimation drying after wet cleaning (e.g., exposing the semiconductor wafer 110 to, for example, a RCA cleaning process). In some such embodiments, the thermal load from the electrostatic chuck 106 may be on the cold tank 212 during sublimation drying and the thermal load from the electrostatic chuck 106 may be on the hot tank 232 during wet cleaning.

Accordingly, in some embodiments, a system for processing a semiconductor device structure comprises a tool comprising a chamber and a platform within the chamber configured to receive a semiconductor device structure thereon. The tool further comprises a heating and cooling system in operable communication with the platform and configured to control a temperature of the platform, the heating and cooling system comprising a cooling system including a cold tank configured to hold a cold thermal transfer fluid, the cold tank configured to be in fluid communication with the platform, thermal transfer fluid supply piping, and thermal transfer fluid return piping, a heating system including a hot tank configured to hold a hot thermal transfer fluid having a higher temperature than the cold thermal transfer fluid, the hot tank configured to be in fluid communication with the platform, the thermal transfer fluid supply piping, and the thermal transfer fluid return piping, and at least one temporary tank configured to receive at least some of the cold thermal transfer fluid or the hot thermal transfer fluid from at least the thermal transfer fluid return piping responsive to switching a thermal load of the platform from one of the cooling system or the heating system to the other of the cooling system or the heating system.

Accordingly, in at least some other embodiments, a system for temperature modification for use with a tool for processing a semiconductor device structure comprises a heating and cooling system configured for operable communication with a platform of a processing tool, the heating and cooling system comprising a cold tank defining a volume configured to hold a cold thermal transfer fluid, the cold tank configured to be in fluid communication with the platform, a hot tank defining a volume configured to hold a hot thermal transfer fluid, the cold tank configured to be in fluid communication with the platform and thermal transfer fluid return piping configured for fluid communication with each of the platform, the cold tank, the hot tank, a first temporary tank configured to be in fluid communication with the cold tank, and a second temporary tank configured to be in fluid communication with the hot tank.

Accordingly, in some embodiments, a method of operating a tool for processing a semiconductor device structure comprises switching a thermal load of a platform of a tool from a cold tank of a heating and cooling apparatus to a hot tank thereof, a cold thermal transfer fluid remaining in thermal transfer fluid piping between the cold tank and the platform, directing the cold thermal transfer fluid remaining in the thermal transfer fluid return piping to a temporary tank in fluid communication with the hot tank while directing a hot thermal transfer fluid from the hot tank to the platform and from the platform to the thermal transfer fluid return piping, directing the hot thermal transfer fluid from the thermal transfer fluid return piping to the hot tank, switching the thermal load of the platform from the hot tank to the cold tank, directing the hot thermal transfer fluid remaining in the thermal transfer fluid return piping to a temporary tank in fluid communication with the cold tank while directing the cold thermal transfer fluid from the cold tank to the platform and from the platform to the thermal transfer fluid return piping, and directing the cold thermal transfer fluid from the thermal transfer fluid return piping to the cold tank.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A system for processing one or more semiconductor devices, the system comprising:
   a tool comprising:
      a chamber; and
      a platform within the chamber configured to receive one or more semiconductor devices thereon; and
   a temperature control system in operable communication with the platform and configured to control a temperature of the platform, the temperature control system comprising:
      a first tank configured to hold a thermal transfer fluid, the first tank configured to be in fluid communication with the platform and thermal transfer fluid piping;
      a second tank configured to hold the thermal transfer fluid at a different temperature than the thermal transfer fluid in the first tank, the second tank configured to be in fluid communication with the platform and the thermal transfer fluid piping; and
      a temporary tank in direct fluid communication with the thermal transfer fluid piping and configured to receive and store at least some of the thermal transfer fluid directly from the thermal transfer fluid piping prior to the first tank or the second tank responsive to switching a thermal load of the platform from one of the first tank or the second tank to the other of the first tank or the second tank.

2. The system of claim 1, wherein the thermal transfer fluid piping comprises a junction, a first portion of the thermal transfer fluid piping in fluid communication with the first tank downstream of the junction and a second portion of the thermal transfer fluid piping in fluid communication with the second tank downstream of the junction.

3. The system of claim 2, wherein the temporary tank is located downstream of the junction.

4. The system of claim 1, further comprising an additional temporary tank in direct fluid communication with the thermal transfer fluid piping, wherein:
   the temporary tank is between the first tank and the thermal transfer fluid piping; and
   the additional temporary tank is between the second tank and the thermal transfer fluid piping.

5. The system of claim 1, wherein the thermal transfer fluid within the first tank comprises the same material composition as the thermal transfer fluid within the second tank.

6. The system of claim 1, further comprising:
   one or more valves between the thermal transfer fluid piping and the first tank and between the thermal transfer fluid piping and the temporary tank, the one or more valves configured to selectively direct the thermal transfer fluid from the thermal transfer fluid piping to the temporary tank and from the thermal transfer fluid piping to the first tank.

7. The system of claim 1, wherein the second tank is configured to maintain a temperature of the thermal transfer fluid about 100° C. greater than the first tank.

8. The system of claim 1, wherein a volume of the temporary tank is between about 5% and about 20% of a volume of the first tank.

9. The system of claim 1, further comprising a condenser in operable communication with the first tank.

10. A system for temperature modification for use with a tool for processing one or more semiconductor devices, the system comprising:
   a tank defining a volume configured to hold a thermal transfer fluid at a first temperature, the tank configured to be in fluid communication with a platform of a processing tool;
   an additional tank defining an additional volume configured to hold the thermal transfer fluid at a second temperature, the additional tank configured to be in fluid communication with the platform;

thermal transfer fluid piping between the platform and each of the tank and the additional tank; and at least one temporary tank directly between the thermal transfer fluid piping and the tank or the additional tank, the at least one temporary tank configured to be in fluid communication with the tank or the additional tank and store the thermal transfer fluid from the thermal transfer fluid piping for a duration responsive to switching a thermal load of the platform from the additional tank to the tank.

11. The system of claim 10, wherein the thermal transfer fluid piping is in fluid communication with each of:

tank return piping;

temporary tank return piping;

additional tank return piping; and valves configured to selectively direct a flow of the thermal transfer fluid from the thermal transfer fluid piping to the tank return piping, the temporary tank return piping, and the additional tank return piping.

12. The system of claim 10, further comprising temporary tank piping coupling the at least one temporary tank to the thermal transfer fluid piping.

13. The system of claim 12, further comprising tank return piping directly coupling the thermal transfer fluid piping to the tank.

* * * * *

UNITED STATES PATENT AND TRADEMARK OFFICE
CERTIFICATE OF CORRECTION

| | | |
|---|---|---|
| PATENT NO. | : 12,020,955 B2 | |
| APPLICATION NO. | : 17/447760 | |
| DATED | : June 25, 2024 | |
| INVENTOR(S) | : Michael E. Koltonski | |

It is certified that error appears in the above-identified patent and that said Letters Patent is hereby corrected as shown below:

In the Specification

Column 1, Line 12, change "hereby incorporated. here in its" to --hereby incorporated herein in its--

Signed and Sealed this
Eighth Day of October, 2024

Katherine Kelly Vidal
*Director of the United States Patent and Trademark Office*